United States Patent
Arai et al.

(10) Patent No.: US 7,222,772 B2
(45) Date of Patent: *May 29, 2007

(54) FLIP CHIP BONDER

(75) Inventors: Kazuhisa Arai, Tokyo (JP); Takashi Mori, Tokyo (JP); Hideyuki Sandoh, Tokyo (JP); Shinichi Namioka, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/820,852

(22) Filed: Apr. 9, 2004

(65) Prior Publication Data

US 2004/0206800 A1 Oct. 21, 2004

(30) Foreign Application Priority Data

Apr. 15, 2003 (JP) ............................. 2003-110538

(51) Int. Cl.
- B23K 1/00 (2006.01)
- B23K 5/00 (2006.01)
- B23K 37/00 (2006.01)
- B23K 28/00 (2006.01)

(52) U.S. Cl. .................. 228/6.2; 228/4.5; 228/264

(58) Field of Classification Search .............. 228/1.1, 228/4.5, 6.1, 6.2

See application file for complete search history.

(56) References Cited

U.S. PATENT DOCUMENTS

| | | | | |
|---|---|---|---|---|
| 3,611,061 A | * | 10/1971 | Segerson | 257/667 |
| 3,735,911 A | * | 5/1973 | Ward | 228/19 |
| 4,321,738 A | * | 3/1982 | Makhijani | 29/76.1 |
| 4,976,392 A | * | 12/1990 | Smith et al. | 228/102 |
| 5,263,620 A | * | 11/1993 | Hernandez et al. | 225/1 |
| 5,340,011 A | * | 8/1994 | Sanchez | 228/4.5 |
| 5,423,931 A | * | 6/1995 | Inoue et al. | 156/94 |
| 5,425,833 A | * | 6/1995 | Fujimoto et al. | 156/344 |
| 5,979,739 A | * | 11/1999 | Jin et al. | 228/6.2 |
| 6,056,191 A | * | 5/2000 | Brouillette et al. | 228/254 |
| 6,276,588 B1 | * | 8/2001 | Johnson | 228/13 |
| 6,698,649 B2 | * | 3/2004 | Mercado et al. | 228/264 |
| 6,719,188 B2 | * | 4/2004 | Farooq et al. | 228/264 |
| 6,773,523 B2 | * | 8/2004 | Fogal et al. | 156/64 |
| 2003/0000993 A1 | * | 1/2003 | Seki et al. | 228/1.1 |

FOREIGN PATENT DOCUMENTS

JP 2002-257829 9/2002

* cited by examiner

Primary Examiner—Lynne R. Edmondson
(74) Attorney, Agent, or Firm—Smith, Gambrell & Russell, LLP

(57) ABSTRACT

A flip chip bonder including a substrate holding mechanism and a chip die bonder for bonding a semiconductor chip having a plurality of electrodes projecting from its front surface to a substrate held on the substrate holding means. The flip chip bonder includes a chuck table, a semiconductor chip take-out area and an electrode cutting area, a cutting mechanism having a cutting tool for cutting the plurality of electrodes projecting from the front surface of the semiconductor chip held on the chuck table and arranged in the electrode cutting area to make them uniform in height, a semiconductor chip take-in mechanism, and a semiconductor chip conveying mechanism.

2 Claims, 6 Drawing Sheets

FLIP CHIP BONDER

FIELD OF THE INVENTION

The present invention relates to a flip chip bonder for bonding a semiconductor chip having a plurality of electrodes projecting from its front surface to a substrate to be implemented.

DESCRIPTION OF THE PRIOR ART

A semiconductor wafer having a plurality of semiconductor chips are divided into individual semiconductor chips by a dicer or the like, and the obtained semiconductor chips are widely used in electric appliances such as cellular telephones and personal computers.

To make electric appliances lightweight and compact, a semiconductor chip called "flip chip" having protuberant bumps as high as 50 to 100 μm which are formed on the electrodes of the semiconductor chip and directly bonded to electrodes formed on a "substrate to be implemented" (to be simply referred to as "substrate" hereinafter) has been developed and put to practical use. Since the above semiconductor chip called "flip chip" is manufactured by forming a plurality of stud bumps (electrodes) on the front surface of the semiconductor chip and bonding it to a substrate via the stud bumps (electrodes), the protuberant bumps (electrodes) must be made uniform in height. The stud bumps are formed by a stud bump bonder using a method in which a ball is formed by melting, under heating, the tip end of a wire such as a gold wire, press-bonded by heating and ultraviolet waves onto the electrode plate of a semiconductor chip, and cut off at its base. However, the thus formed stud bumps are not uniform in height. Since the flip chip is bonded to a substrate by a flip chip bonder, the stud bumps (electrodes) must be uniform in height. To realize this, grinding is generally used. However, when the stud bumps (electrodes) are ground, burrs are produced if the bumps (electrodes) are made of a sticky metal such as gold or the like, thereby inviting a problem that a short circuit is caused between adjacent bumps (electrodes).

As a technology for making a plurality of stud bumps (electrodes) formed on the front surface of a semiconductor chip uniform in height, an unexamined published Japanese patent application JP-A 2001-53097 proposes to make them uniform in height by pressing a heated plate against them.

When the bumps are made uniform in height by pressing the heated plate against them, however, the heads of the bumps are crushed, thereby having a problem that a short circuit is caused between adjacent bumps. To solve this problem, in the invention disclosed by the above publication, an additional step of removing the tip end portions of the bumps is provided.

SUMMARY OF THE INVENTION

It is an object of the present invention to provide a flip chip bonder capable of easily making a plurality of electrodes projecting from the front surface of a semiconductor chip uniform in height, without causing a short circuit.

According to the present invention, the above object can be attained by a flip chip bonder comprising a substrate holding means arranged in a chip die bonding area and a chip die bonder for bonding a semiconductor chip having a plurality of electrodes projecting from its front surface onto a substrate to be implemented, held on the substrate holding means, wherein the flip chip bonder comprises a chuck table for holding a semiconductor chip, which can be moved to a semiconductor chip take-in area, a semiconductor chip take-out area and an electrode cutting area, a cutting means having a cutting tool for cutting a plurality of electrodes projecting from the front surface of the semiconductor chip arranged in the electrode cutting area and held on the chuck table to make them uniform in height, a semiconductor chip take-in means for carrying a semiconductor chip before processing to the chuck table positioned in the semiconductor chip take-in area, and a semiconductor chip conveying means for carrying a semiconductor chip after processing, which is held on the chuck table positioned in the semiconductor chip take-out area, to the chip die bonder.

Preferably, the flip chip bonder further comprises a processing fluid supply means for supplying a processing fluid toward the semiconductor chip held on the chuck table in the electrode cutting area, and the processing fluid supply means supplies ionized air.

DETAILED DESCRIPTION OF THE PREFERRED EMBODIMENTS

A flip chip bonder according to preferred embodiments of the present invention will be described in detail hereinbelow with reference to the accompanying drawings.

Figure 1:
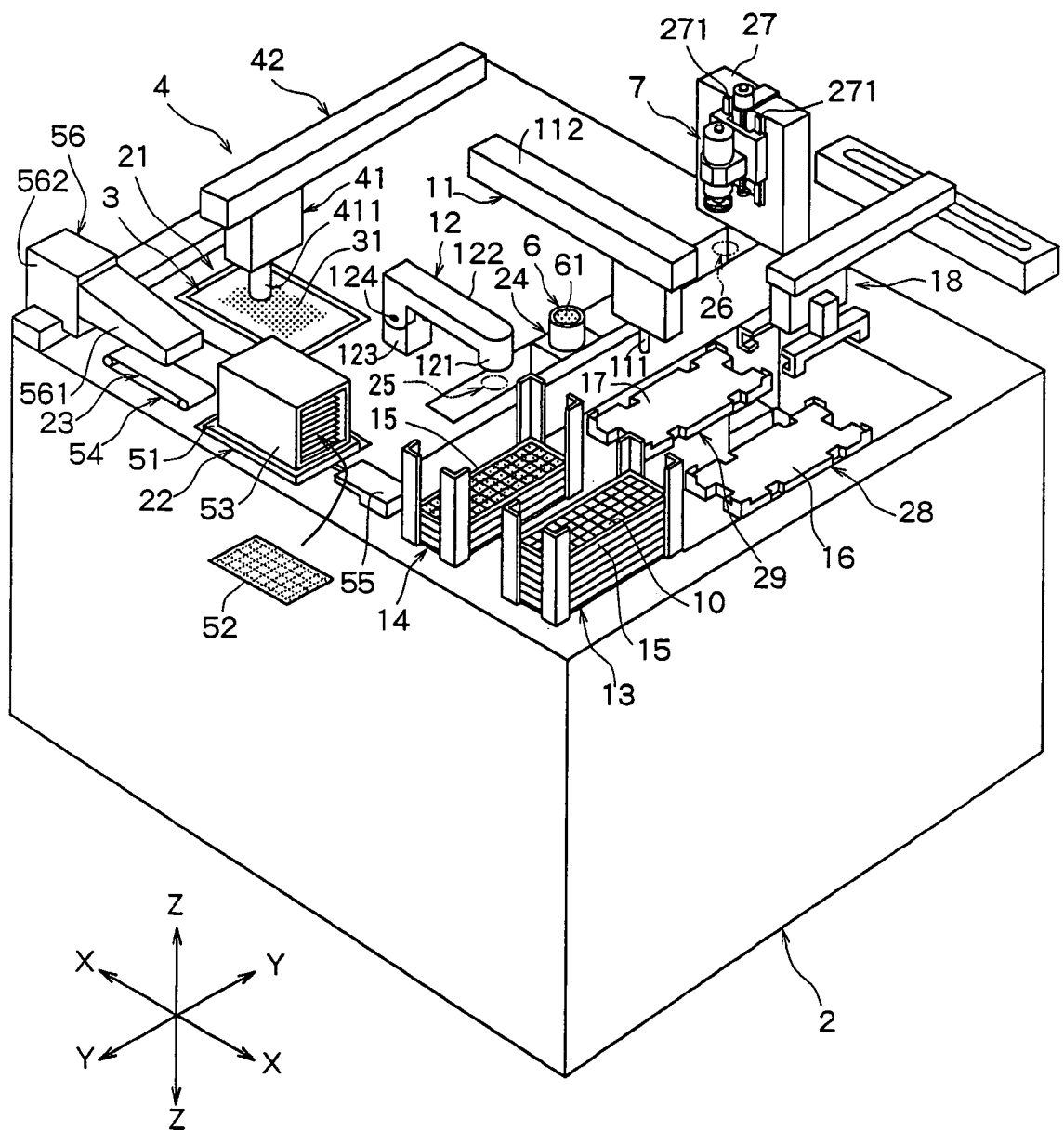
FIG. 1 is a perspective view of a flip chip bonder constituted according to an embodiment of the present invention.

FIG. 1 is a perspective view of a flip chip bonder constituted according to the present invention.

The flip chip bonder in the illustrated embodiment has a rectangular parallelepiped housing denoted as a whole by 2. A chip die bonding area 21 is formed in the lower left corner of the housing 2 in the drawing. In this chip die bonding area 21, a substrate holding means 3 is arranged. This substrate holding means 3 comprises a chuck table 31 made of a suitable porous material such as porous ceramics and a suction means (not shown) for applying negative pressure to the chuck table 31. In the chip die bonding area 21, a chip die bonder 4 for bonding a semiconductor chip that will be described later to a substrate that is held on the chuck table 31 and will be described later is installed. The chip die bonder 4 comprises a bonding head 41 and a bonding head moving means 42 for moving the bonding head 41 in the X, Y and Z directions. The bonding head 41 has a collet 411 for suction-holding the semiconductor chip, which will be described later.

A cassette placing portion 22 and a substrate temporary storage portion 23 are arranged in the lower left corner of the above chip bonding area 21 of the housing 2 in the drawing.

A cassette placing table 51 supported on a lifting means (not shown) is arranged on the cassette placing portion 22 and a cassette 53 storing a substrate 52 is placed on this cassette placing table 51. A substrate temporary storage means 54 is arranged on the above substrate temporary storage portion 23. This substrate temporary storage means 54 is composed of a belt mechanism which consists of a drive roller that is driven in a normal direction or reverse direction by an electric motor that is not shown, a driven roller arranged at a predetermined distance from the drive roller and an endless belt put on the drive roller and the driven roller. A substrate take-out means 55 is installed on the side opposite to the substrate temporary storage portion 23 across the cassette placing portion 22. This substrate take-out means 55 can move in the X direction in the drawing, and carries a substrate 52 stored in the cassette 53 placed on the cassette placing table 51 onto the substrate temporary storage means 54. The illustrated flip chip bonder comprises a substrate conveying means 56 for conveying the substrate 52 carried to the substrate temporary storage means 54 onto the top of the chuck table 31 of the above substrate holding means 3. The substrate conveying means 56 comprises a suction-holding tool 561 for suction-holding the substrate 52 and a suction-holding tool moving means 562 for moving the suction-holding tool 561 in the Y and Z directions.

A semiconductor chip take-in area 24, a semiconductor chip take-out area 25 and an electrode cutting area 26 are arranged in the center portion in the X direction of the housing 2. A chuck table unit 6 is installed between the semiconductor chip take-out area 25 and the electrode cutting area 26. The chuck table unit 6 has a chuck table 61 made of a suitable porous material such as porous ceramics, a suction means (not shown) for applying negative pressure to the chuck table 61 and a chuck table moving mechanism (not shown) for moving the chuck table 61 in the X direction to position it in the semiconductor chip take-in area 24, the semiconductor chip take-out area 25 and the electrode cutting area 26. The chuck table unit 6 has a rotation drive mechanism for rotating the chuck table 61.

In the electrode cutting area 26 of the housing 2, a cutting means 7 is installed. This cutting means 7 is mounted on an upright wall 27 provided on the housing 2. That is, a pair of guide rails 271 and 271 extending in the vertical direction are installed on the front side of the upright wall 22, and the cutting means 7 is mounted on the pair of guide rails 271 and 271 in such a manner that it can move in the vertical direction. The cutting means 7 will be described hereinbelow with reference to FIG. 2. The cutting means 7 has a movable base 71 and a spindle unit 72 mounted on the movable base 71. The movable base 71 is provided with a pair of legs 711 and 711 extending in the vertical direction on both sides of the rear side and to-be-guided grooves 712 and 712 to be slidably engaged with the pair of guide rails 271 and 271 are formed in the pair of legs 711 and 711. A support portion 713 projecting forward is installed on the front side of the movable base 71 slidably mounted on the pair of guide rails 271 and 271 provided on the upright wall 22. The spindle unit 72 is fitted to the support portion 713.

The spindle unit 72 comprises a spindle housing 721 fitted in the support portion 713, a rotary spindle 722 rotatably arranged in the spindle housing 721, and a servo motor 723 as a drive source for rotary-driving the rotary spindle 722. The lower end portion of the rotary spindle 722 is projected downward beyond the lower end of the spindle housing 721, and a disk-like tool attachment member 724 is arranged to the lower end portion. A plurality of bolt insertion holes (not shown) are formed in the tool attachment member 724 at predetermined intervals in the circumferential direction. A cutting tool 73 is mounted to the under surface of the tool attachment member 724.

An example of the cutting tool 73 will be described with reference to FIG. 3 and FIG. 4.

Figure 3:
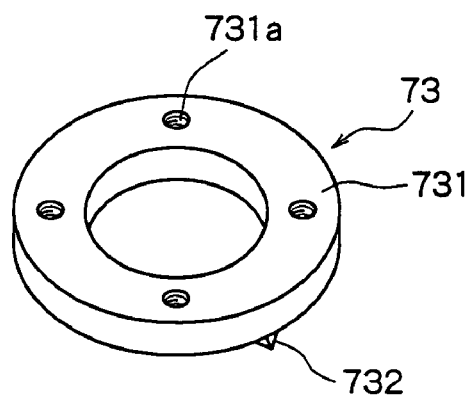
FIG. 3 is a perspective view of an example of a cutting tool constituting a cutting means provided in the flip chip bonder shown in FIG. 1.
Figure 4:
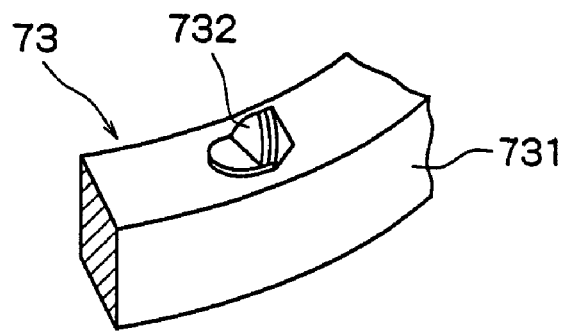
FIG. 4 is an enlarged perspective view of the substantial section of the cutting tool shown in FIG. 3 when seen from the bottom side.

The cutting tool 73 shown in FIG. 3 and FIG. 4 comprises a ring-like base 731 and a cutting blade 732 attached to at least one position of one surface side of the base 731. The base 731 is made of an aluminum alloy or the like, and a plurality of blind screw holes 731a extending from one surface side to the other surface side are formed in the base 731. The cutting blade 732 is installed upright from the base 731, has an acute-angled end and is composed of a diamond cutting tool, for example. The thus constituted cutting tool 73 is mounted to the tool attachment member 724 by positioning it on the under surface of the tool attachment member 724 fixed to the lower end portion of the rotary spindle 722 in such a manner that one side having the cutting blade 732 of the cutting tool 73 faces down and by screwing fastening bolts 725 into the blind screw holes 731a formed in the base 731 via through holes formed in the tool attachment member 724.

Other examples of the cutting tool will be described with reference to FIGS. 5 to 7.

Figure 5:
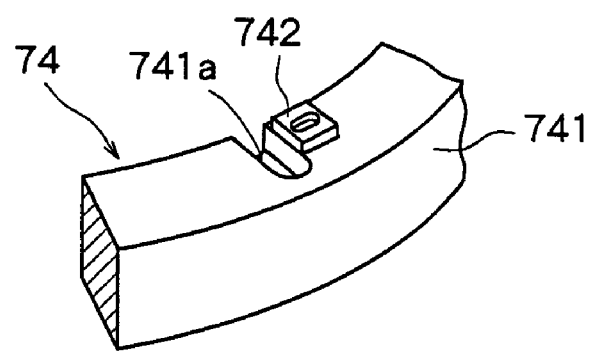
FIG. 5 is an enlarged perspective view of the substantial section of another example of the cutting tool.

A cutting tool 74 shown in FIG. 5 is constructed by forming at least one depression 741a on one side of a ring-like base 741 and mounting a cutting blade 742 such as a rectangular super steel cutting tool or diamond cutting tool having a thickness of several millimeters in proximity to the depression 741a.

Figure 6:
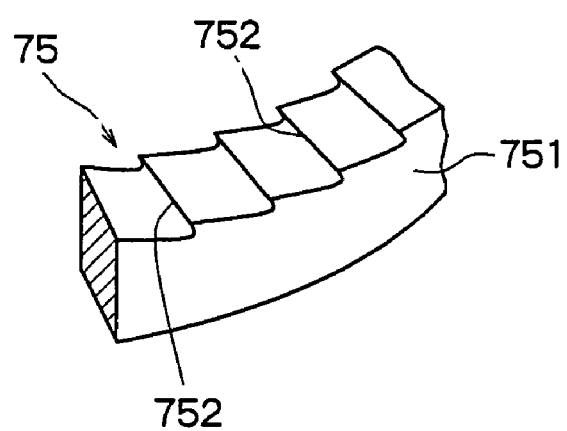
FIG. 6 is an enlarged perspective view of the substantial section of still another example of the cutting tool

A cutting tool 75 shown in FIG. 6 is constituted such that a ring base 751 is made of tool steel such as super steel alloy and at least one cutting blade 752 (plural in the example shown in FIG. 6) acute-angled in the rotation direction is formed at least one position of one side of the base 751. A diamond chip may be provided on the surface of the cutting blade 752.

Figure 7:
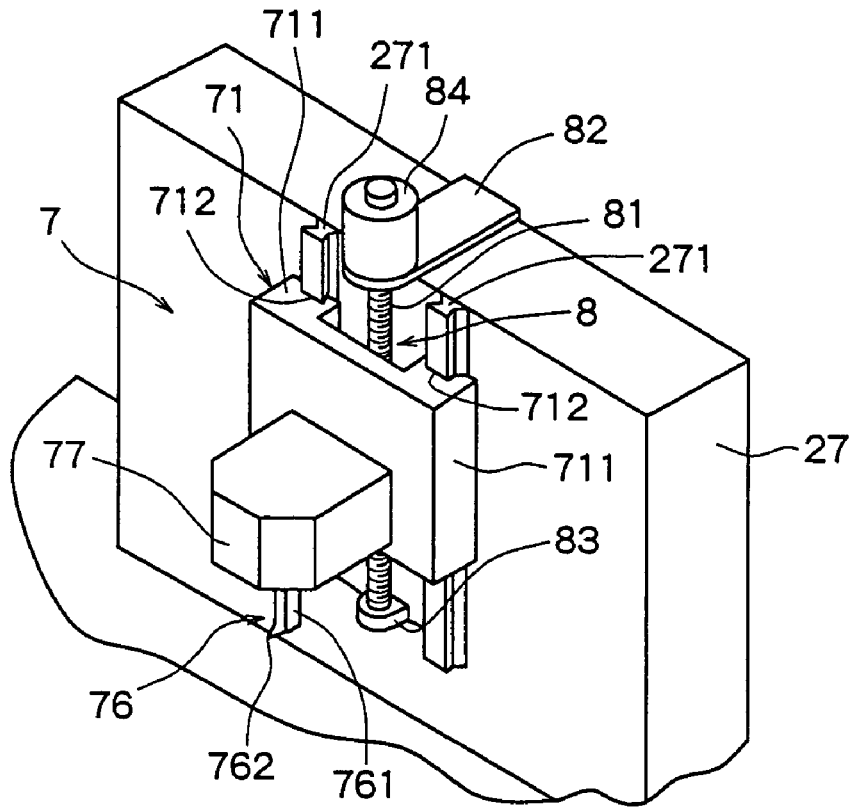
FIG. 7 is a perspective view of a further example of the cutting tool mounted to the cutting means.

A cutting tool 76 shown in FIG. 7 has a cutting blade 762 made of diamond at the end of its tool body 761 which is formed like a rod and made of tool steel such as super steel alloy. When the cutting tool 76 shown in FIG. 7 is used, the tool attachment member 77 is directly mounted to the movable base 71 constituting the cutting means 7 and the tool body 761 is attached to the tool attachment member 77.

Returning to FIG. 2, the flip chip bonder in the illustrated embodiment has a cutting means feed mechanism 8 for moving the above cutting means 7 along the pair of guide rails 271 and 271 in the vertical direction (direction perpendicular to the placing surface of the chuck table 61). This cutting means feed mechanism 8 has a male screw rod 81 arranged on the front side of the upright wall 22 and extending substantially vertically. The upper end portion and lower end portion of this male screw rod 81 are rotatably supported by bearing members 82 and 83 mounted to the upright wall 22, respectively. A pulse motor 84 as a drive source for rotary-driving the male screw rod 81 is mounted on the upper bearing member 82, and the output shaft of this pulse motor is coupled to the male screw rod 81. A couple portion (not shown) projecting backward from the center portion in the width direction of the rear side of the movable base 71 is formed on the rear side thereof, a threaded screw hole extending in the vertical direction is formed in the coupling portion, and the above male screw rod 81 is screwed into the threaded screw hole. Therefore, when the pulse motor 84 rotates in a normal direction, the movable base 71, that is, the cutting means 7 is lowered, that is, advanced, while when the pulse motor 84 rotates in a reverse direction, the movable base 71, that is, the cutting means 7 is moved up, that is, retreated.

The flip chip bonder in the illustrated embodiment comprises a nozzle 9 that is processing fluid supply means for supplying a processing fluid toward a semiconductor chip held on the chuck table 61 in the electrode cutting area 26 in the side direction of the electrode cutting area 26 in the housing 2. The processing fluid may be air, cutting water, mist or ionized air. Ionized air is preferred in order to remove static electricity. Therefore, the nozzle 9 in the illustrated embodiment is connected to an ionized air supply means that is not shown.

Returning to FIG. 1, the flip chip bonder in the illustrated embodiment has a semiconductor chip take-in means 11 arranged above the semiconductor chip take-in area 24. This semiconductor chip take-in means 11 has a collet 111 and a moving means 112 for moving the collet 111 in the X and Z directions. The thus constituted semiconductor chip take-in means 11 carries a semiconductor chip before processing which will be described later to the top of the chuck table 61 by adsorbing it with the collet 111. Further, the flip chip bonder in the illustrated embodiment has a semiconductor chip conveying means 12 arranged between the semiconductor chip take-out area 25 and the above chip die bonding area 21. This semiconductor chip conveying means 12 has a collet 121 and a turning arm 122 having the collet 121 at one end thereof, and the base portion of the turning arm 122 is supported to a support member 123 by a support shaft 124 in such a manner that it can turn at an angle of up to 1800. The semiconductor chip conveying means 12 has a drive means (not shown) for turning the turning arm 122 on the support shaft 124 at an angle of up to 180°. The thus constituted semiconductor chip conveying means 12 suction-holds and inverts the semiconductor chip after processing held on the chuck table 61 positioned in the semiconductor chip take-out area 25 by means of the collet 121 and carries it to a semiconductor chip receiving position in the working range of the above chip die bonder 4.

Figure 8:
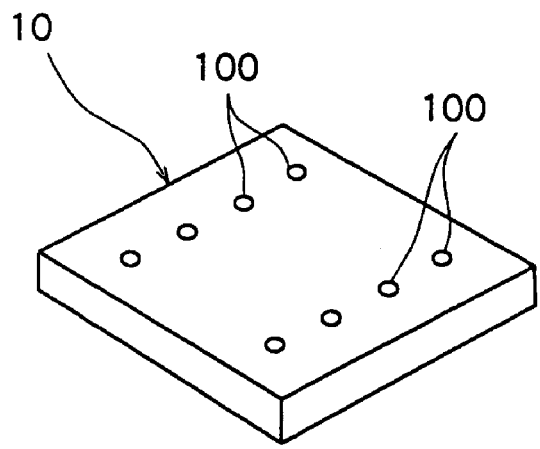
FIG. 8 is a perspective view of a semiconductor wafer having stud bumps formed on the front surface.
Figure 9:
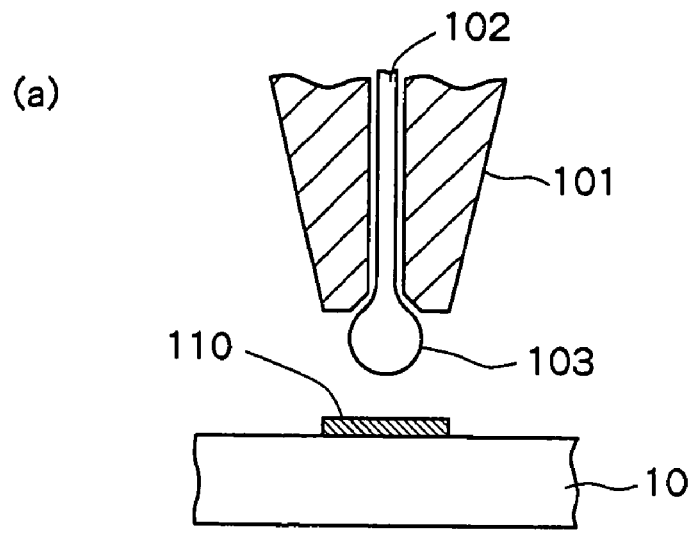
FIGS. 9(*a*), 9(*b*) and 9(*c*) are diagrams for explaining the formation of stud bumps on the front surface of a semiconductor chip.
Figure 9:
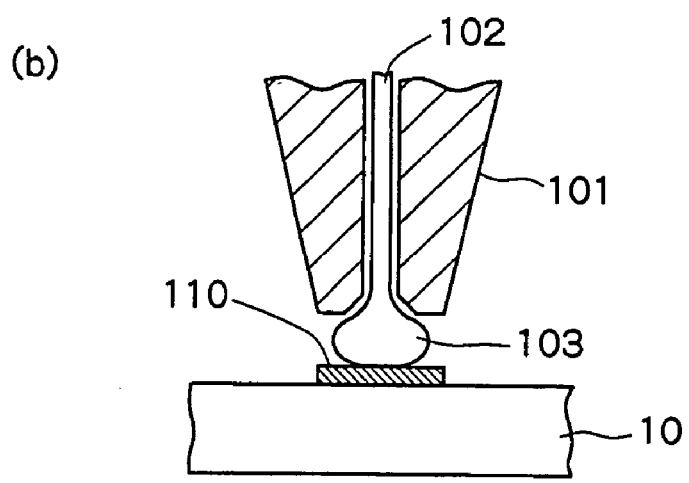
Figure 9:
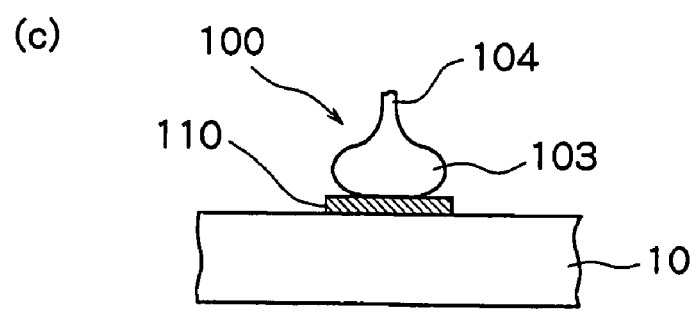

With reference to FIG. 1, a first tray placing means 13 and a second tray placing means 14 are installed on the lower right end portion of the housing 2 in the drawing. A tray 15 storing a semiconductor chip 10 before processing is placed on the first tray placing means 13 whereas an empty tray 15 from which the semiconductor chip before processing has been taken out is placed on the second tray placing means 14. The semiconductor chip 10 before processing stored in the tray 15 will be described with reference to FIG. 8 and FIG. 9. The semiconductor chip 10 before processing has a plurality (eight in the illustrated embodiment) of stud bumps (electrodes) 100 projecting from its front surface as shown in FIG. 8. The stud bumps (electrodes) 100 are formed by a stud bump forming method, for example. That is, as shown in FIG. 9(*a*), the tip end of a gold wire 102 inserted into a capillary 101 is molten under heating of discharge with an electric torch to form a ball 103, and this ball 103 is press-bonded by heat and ultrasonic waves onto an electrode plate 110 made of aluminum formed on the semiconductor chip 10 as shown in FIG. 9(*b*), and cut off at its base. A plurality of stud bumps (electrodes) 100 thus formed have needle-like whiskers 104 and are not uniform in height as shown in FIG. 9(*c*).

Returning to FIG. 1, in the flip chip bonder in the illustrated embodiment, a first tray setting portion 28 and a second tray setting portion 29 are arranged on the upper right side in the drawing of the first tray placing means 13 and the second tray placing means 14 of the housing 2, and a first tray holding base 16 and a second tray holding base 17 are placed on the first tray setting portion 28 and the second tray setting portion 29, respectively. The first tray holding base 16 and the second tray holding base 17 are moved in the Y direction between the first tray placing means 13 and the second tray placing means 14, and supported by a moving mechanism (not shown) which can move in the vertical direction shown by the arrow Z. The illustrated flip chip bonder has a tray conveying means 18 for carrying the tray 16 placed on the first tray holding base 16 positioned on the first tray setting portion 28 to the top of the second tray holding base 17 positioned on the second tray setting portion 29.

The flip chip bonder in the illustrated embodiment is constituted as described above, and its operation will be described hereinbelow.

A plurality of trays 15 storing a predetermined number of semiconductor chips 10 as workpieces before processing are placed on the first tray placing means 13. To move the tray 15 placed on the first tray placing means 13 to the top of the first tray holding base 16, the first tray holding base 16 positioned on the first tray setting portion 28 is moved down by a moving mechanism (not shown) and located below the first tray placing means 13. The first tray holding base 16 is moved up and the lowest tray 15 placed on the first tray placing means 13 is placed on the first tray holding base 16. A holding means for holding the lowest-positioned tray 15 is provided at the lower end of the first tray placing means 13, and when the first tray holding base 16 moves up and comes into contact with the holding means, the holding of the lowest-positioned tray 15 is released so that the lowest tray 15 is placed on the first tray holding base 16. After the lowest-positioned tray 15 placed on the first tray placing means 13 is thus placed on the first tray holding base 16, the first tray holding base 16 is brought its position to the first tray setting portion 28 by the moving mechanism that is not shown. The tray 15 storing a predetermined number of semiconductor chips 10 before processing, which has been positioned on the first tray setting portion 28 is carried onto the second tray holding base 17 positioned on the second tray setting portion 29 by the tray conveying means 18.

Next, the semiconductor chip take-in means 11 is operated to allow the collet 111 to suction-hold one of the semiconductor chips 110 as a workpiece before processing stored in the tray 15 carried onto the second tray holding base 17 positioned on the second tray setting portion 29, and carries it to the top of the chuck table 61 of the chuck table unit 6 positioned in the semiconductor chip take-in area 24. After the semiconductor chip 10 before processing is thus carried onto the chuck table 61, the semiconductor chip 10 placed on the chuck table 61 is suction-held on the chuck table 61 by a suction means that is not shown.

Figure 2:
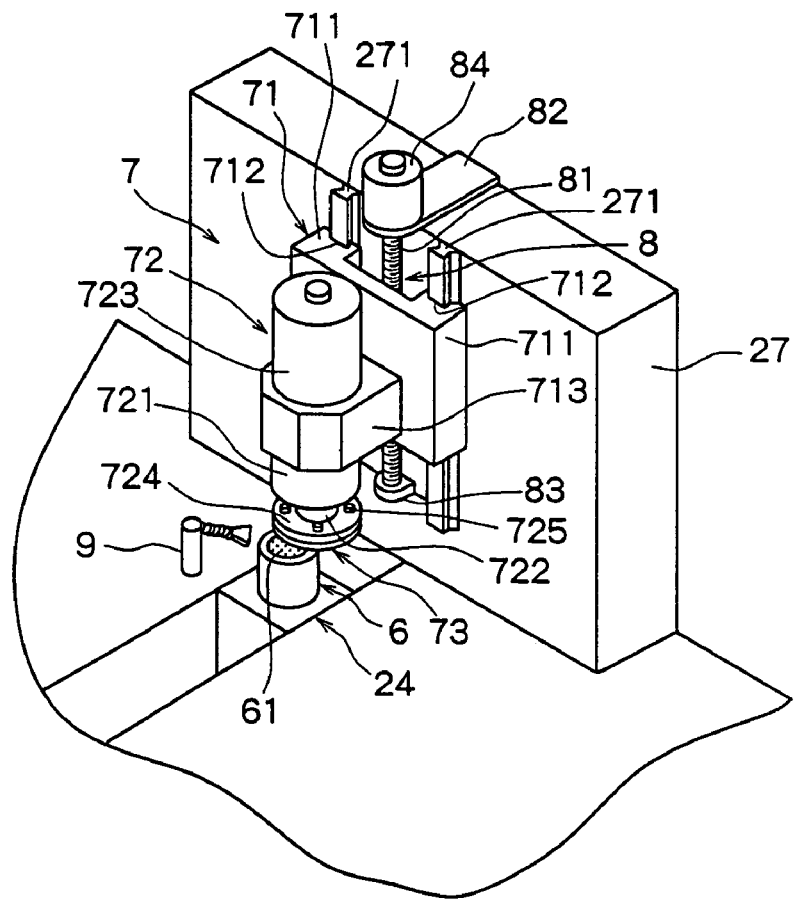
FIG. 2 is a perspective view of the substantial section of the flip chip bonder shown in FIG. 1.

After the semiconductor chip 10 is suction-held on the chuck table 61, the chuck table 61 is moved to the electrode cutting area 26 and is brought at a position where it faces the cutting tool 73 of the cutting means 7. Cutting is carried out with the cutting means 7 to make uniform in height the plurality of stud bumps (electrodes) 100 formed on the front surface of the semiconductor chip 10. The cutting tools 73 shown in FIG. 2 and FIG. 3 are used as the cutting tool.

When the chuck table 61 is positioned in the electrode cutting area 26, the cutting means 7 is lowered while the chuck table 61 and the rotary spindle 722 of the cutting means 7 are caused to rotate. As a result, the cutting blade 732 of the cutting tool 73 rotated together with the revolution of the rotary spindle 722 is brought into contact with the plurality of stud bumps (electrodes) 100 formed on the front surface of the semiconductor chip 10 to cut away the top end portions of the stud bumps (electrodes) 120 gradually.

Figure 10:
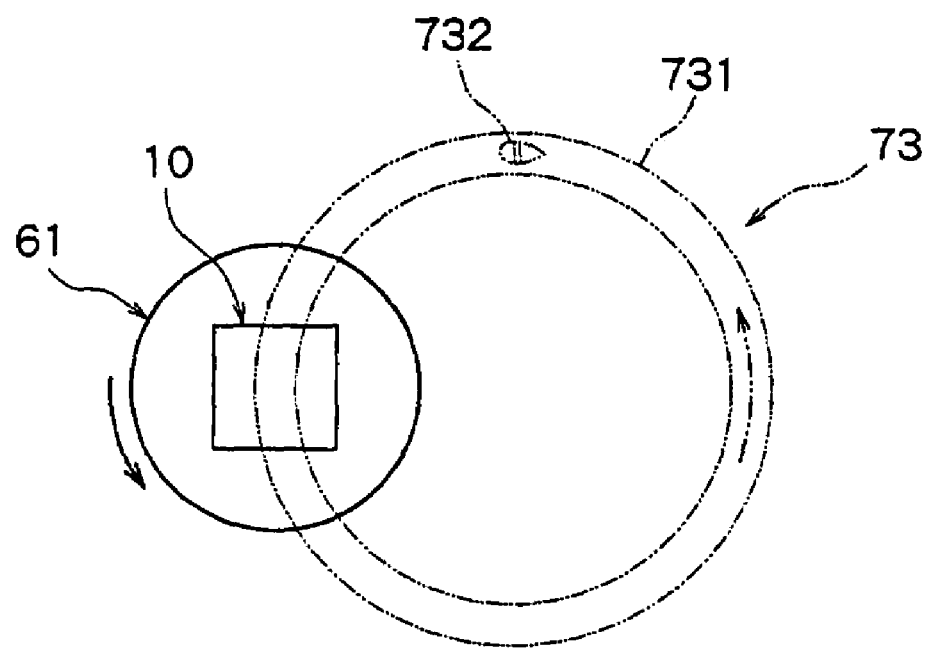
FIG. 10 is a diagram showing the relationship between the semiconductor chip held on a chuck table and the cutting tool.

The relationship between the semiconductor chip 10 held on the chuck table 61 and the cutting tool 73 will be described with reference to FIG. 10.

Figure 11:
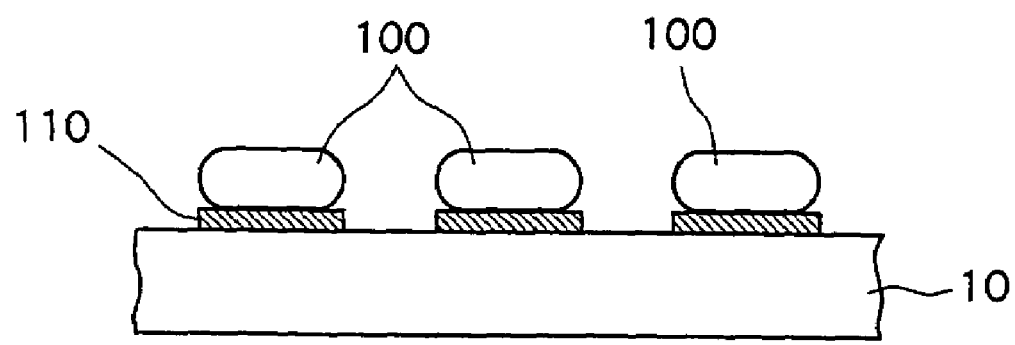
FIG. 11 is a diagram showing a state of bumps (electrodes) formed on the semiconductor chip being cut.

The semiconductor chip 10 is located at a position where the cutting blade 732 of the cutting tool 73 passes the center portion of the semiconductor chip 10. The chuck table 61, that is, the semiconductor chip 10 is rotated in the direction indicated by the arrow at a revolution of 10 rpm or less and simultaneously, the cutting tool 73 is caused to rotate in the direction indicated by the arrow at a revolution of 3,000 rpm or more. Namely, the semiconductor chip 10 and the cutting tool 73 are rotated in the same direction. By allowing the semiconductor chip 10 and the cutting tool 73 to rotate as described above, the plurality of stud bumps (electrodes) 100 formed on the front surface of the semiconductor chip 10 are cut away by cutting at their end portion as shown in FIG. 11 to make them uniform in height. Therefore, the plurality of stud bumps (electrodes) 100 are easily made uniform in height without causing a short circuit.

When the cutting tool 76 shown in FIG. 7 is used as the cutting tool, as the cutting tool 76 is fixed, the chuck table 61 is moved a distance corresponding to the length of the semiconductor chip 10 in the X direction while being caused to rotate.

At the time of the above processing, ionized air is ejected toward the semiconductor chip 10 under processing from the nozzle 9 installed in the side direction of the electrode cutting area 26. By ejecting ionized air toward the semiconductor chip 10 under processing, static electricity generated at the time of processing can be removed and further, a cooling effect is obtained.

After the plurality of bumps (electrodes) 100 formed on the front surface of the semiconductor chip 10 are cut, the cutting means 7 is moved up and the revolution of the rotary spindle 722 and the revolution of the chuck table 61 are suspended. Thereafter, the chuck table 61 is positioned in the semiconductor chip take-out area 25 and the suction-holding of the cut semiconductor chip 10 on the chuck table 61 is canceled. The semiconductor chip 10 whose suction-holding has been cancelled is carried to the semiconductor chip receiving position in the working area of the chip die bonder 4 by the semiconductor chip conveying means 12. On this occasion, the semiconductor chip 10 whose front surface is suction-held by the collet 121 of the semiconductor chip conveying means 12 is inverted by the turning arm 122 having the collet 121 which is turned on the support shaft 124 by 1800 so that the rear surface faces up.

One of the substrates 52 stored in the cassette 53 placed on the cassette placing table 51 is carried onto the chuck table 31 of the substrate holding means 3 during the above procedure. That is, the substrate take-out means 55 is moved toward the cassette placing table 51 to force out the substrate 52 stored at a predetermined position of the cassette 53 and to carry it to the top of the substrate temporary storage means 54. The substrate temporary storage means 54 which is a belt mechanism moves the substrate 52 to a predetermined position. Then, the substrate conveying means 56 is activated to carry the substrate 52 on the substrate temporary storage means 54 to the top of the chuck table 31 of the substrate holding means 3. The substrate 52 carried to the top of the chuck table 31 is suction-held.

After the semiconductor chip 10 whose bumps (electrodes) 100 formed on the front surface have been cut is carried to the semiconductor chip receiving position in the working area of the chip die bonder 4 by the semiconductor chip conveying means 12 as described above, the chip die bonder 4 is activated so that the collet 411 suction-holds the rear surface of the semiconductor chip 10. The bonding head moving means 42 is activated to position the semiconductor chip 10 suction-held by the collet 411 at a predetermined position of the substrate 52 held on the chuck table 31 so as to press and bond the semiconductor chip 10 to the substrate 52. In this bonding, as the plurality of bumps (electrodes) 100 formed on the front surface of the semiconductor chip 10 have been cut and made uniform in height, the semiconductor chip 10 can be bonded without fail. Since the plurality of bumps (electrodes) 100 are cut and their bonding surfaces are activated, the semiconductor chip 10 can be bonded without fail simply by pressing it against the predetermined position of the substrate 52.

After the above operation is repeated to bond a predetermined number of the semiconductor chips 10 to the substrate, the suction-holding of the substrate 52 to the chuck table 31 is canceled. The substrate conveying means 56 is activated to carry the substrate 52 on the chuck table 31 to the top of the substrate temporary storage means 54. The substrate temporary storage means 54 is activated to move the substrate 52 toward the cassette placing table 51 so as to insert the substrate 52 into the cassette 53 at a predetermined position. At this point, the substrate take-out means 55 is activated to hold the substrate 52 inserted into the cassette 53 at the predetermined position and position it at the predetermined storage position of the cassette 53.

The flip chip bonder constituted according to the present invention comprises a chuck table for holding a semiconductor chip, which can be moved to a semiconductor chip take-in area, a semiconductor chip take-out area and an electrode cutting area, cutting means having a cutting tool for cutting a plurality of electrodes projecting from the front surface of the semiconductor chip held on the chuck table and arranged in the electrode cutting area to make them uniform in height, semiconductor chip take-in means for carrying the semiconductor chip before processing to the chuck table positioned in the semiconductor chip take-in area, and semiconductor chip conveying means for carrying the semiconductor chip after processing held on the chuck table positioned in the semiconductor chip take-out area to the chip die bonder. Since the end portions of the electrodes projecting from the front surface of the semiconductor chip are cut away, the electrodes can be easily made uniform in height without causing a short circuit. Consequently, the plurality of bump electrodes formed on the front surface of the semiconductor chip can be bonded to the substrate without fail.

We claim:

1. A flip chip bonder comprising substrate holding means arranged in a chip die bonding area and a chip die bonder for bonding a semiconductor chip having a plurality of electrodes projecting from its front surface to a substrate to be implemented, held on the substrate holding means, wherein the flip chip bonder comprises a chuck table for holding a semiconductor chip, which can be moved to a semiconductor chip take-in area, a semiconductor chip take-out area and an electrode cutting area, a mechanical cutting means having a cutting tool with a cutting blade for cutting the plurality of electrodes projecting from the front surface of the semiconductor chip held on the chuck table and arranged in the electrode cutting area to make them uniform in height, a semiconductor chip take-in means for carrying a semiconductor chip before processing to the chuck table positioned in the semiconductor chip take-in area, and a semiconductor chip conveying means for carrying a semiconductor chip after processing, which is held on the chuck table positioned in the semiconductor chip take-out area, to the chip die bonder, and comprises a processing fluid supply means for supplying a processing fluid toward the semiconductor chip held on the chuck table in the electrode cutting area.

2. The flip chip bonder according to claim 1, wherein the processing fluid supply means supplies ionized air.

* * * * *